US006191014B1

(12) United States Patent
Sasajima et al.

(10) Patent No.: US 6,191,014 B1
(45) Date of Patent: Feb. 20, 2001

(54) METHOD FOR MANUFACTURING COMPOUND SEMICONDUCTOR

(75) Inventors: Yuichi Sasajima, Austin, TX (US); Masahiko Hata; Toshimitsu Abe, both of Ibaraki (JP)

(73) Assignee: Sumitomo Chemical Company, Ltd., Osaka (JP)

(*) Notice: Under 35 U.S.C. 154(b), the term of this patent shall be extended for 0 days.

(21) Appl. No.: 09/361,617

(22) Filed: Jul. 27, 1999

(30) Foreign Application Priority Data

Jul. 27, 1998 (JP) .................................................. 10-210869

(51) Int. Cl.$^7$ .............................. H01L 21/22; H01L 21/38
(52) U.S. Cl. ........................... 438/565; 438/569; 438/918
(58) Field of Search .......................... 117/954; 257/102; 438/45, 46, 565, 569, 681, 918, 930, FOR 470; H01L 21/22, 21/38, 21/205

(56) References Cited

U.S. PATENT DOCUMENTS 5,064,778 * 11/1991 Maeda et al. ..................... 117/88
5,244,829 * 9/1993 Kim et al. ........................ 117/104

FOREIGN PATENT DOCUMENTS

| 05291275 | * 11/1993 | (JP) . |
| 9-186094 | 7/1997 | (JP) . |
| 9-219370 | 8/1997 | (JP) . |
| 9-320969 | 12/1997 | (JP) . |

OTHER PUBLICATIONS

Veiling et al., LP–MOVPE grown GaAs– and InP–based HBTs using all–liquid alternative sources, 1999 Eleventh International Conference on Indium Phosphide and Related Materials, pp. 467–470.*

B.T. Cunningham, et al., "Heavy Carbon Doping of Metalorganic Chemical Vapor Deposition Grown GaAs Using Carbon Tetrachloride", Appl. Phys. Lett. 54 (19), May 8, 1989, pp. 1905–1907.

N.I. Buchan, et al., "Carbon Incorporation in Metalorganic Vapor Phase Epitaxy Grown GaAs Using $CH_yX_{4-y}$, TMG and $AsH_3$", Journal of Crystal Growth 110 (1991), pp. 405–414.

L. W. Yang, et al., "Heavily Doped p–GaAs Grown by Low–pressure Organometallic Vapor Phase Epitaxy Using Liquid $CCl_4$", J. Appl. Phys. 72(4), Sep. 1, 1992, pp. 2063–2065.

* cited by examiner

Primary Examiner—Richard Elms
Assistant Examiner—Christian D. Wilson
(74) Attorney, Agent, or Firm—Pillsbury Madison & Sutro LLP

(57) ABSTRACT

Provided is a manufacturing method of a compound semiconductor having at least one layer of carbon-doped p-type semiconductor epitaxial layer by a MOVPE process, wherein carbon trichloride bromide is used as a carbon source of carbon to be added to the p-type semiconductor epitaxial layer. In the method the etching amount during growth is relatively small, and carbon can be added to a high concentration even with a large MOVPE apparatus.

4 Claims, 2 Drawing Sheets

METHOD FOR MANUFACTURING COMPOUND SEMICONDUCTOR

BACKGROUND OF THE INVENTION

1. Field of the Invention

The present invention relates to a method for manufacturing a compound semiconductor having at least one layer, which is a carbon-doped p-type semiconductor epitaxial layer produced by a metalorganic vapor phase growth process.

2. Description of the Related Art

As a doping method for manufacturing a p-type semiconductor epitaxial layer of a carbon-doped GaAs, AlGaAs, or InGaAs having a p-type conduction to be manufactured by a metalorganic vapor phase growth process (hereinafter, may be referred to as MOVPE process), techniques using carbon tetrachloride and carbon tetrabromide as a carbon source are known. Use of the above carbon sources results in a good incorporation efficiency of carbon into a p-type semiconductor epitaxial layer. This can provide a high carrier concentration of GaAs, AlGaAs, or InGaAs in the epitaxial layer having a p-type conduction. The high carrier concentration carbon-doped p-type GaAs and p-type InGaAs thus manufactured are used as, for example, a base layer of a Hetero Bipolar Transistor (HBT). The carbon in GaAs has a small diffusion constant in comparison with other p-type impurities such as Be and Zn, which enables the growth of a base layer excellent in reliability. The characteristic of the base layer is one of the factors that exerts a large influence on the HBT device characteristics.

However, in order to dope a p-type semiconductor epitaxial layer of GaAs, AlGaAs, or InGaAs with carbon to a high concentration, by using carbon tetrabromide as a carbon source, which has a melting point of 90° C., and is a solid at room temperature, the doping needs to be carried out by sublimation. However, as carbon tetrabromide has a low vapor pressure of 0.6 mmHg/23° C., although it is still a high efficiency carbon source, it is instable in vapor pressure, and it may be difficult to realize sufficient vapor pressure. Also, in the future, in the case where an increase in diameter of an epitaxial substrate, or an increase in size of a device for the purpose of productivity improvement is required, the supply may sometimes become insufficient for obtaining a semiconductor epitaxial substrate having a high carrier concentration.

It is also known that, in the growth of a high carrier concentration semiconductor epitaxial layer having a p-type conduction by a MOVPE process, an increase in supply of carbon tetrachloride or carbon tetrabromide, or an increase in growth temperature for enhancing the crystallinity of the epitaxial film results in the formation of hydrogen chloride or hydrogen bromide in the reaction process; this causes etching to proceed, and results in a difficulty in control of the epitaxial film thickness (J. Appl. Phys. 72, 2063 (1992), Japanese Laid-Open Patent Publication No. Hei 9-219370). Especially, the etching amount is large in the case where carbon tetrachloride is used as a carbon source, and hence it is not preferable.

An object of the present invention is to provide a method for manufacturing a compound semiconductor having at least one layer, which is a carbon-doped p-type semiconductor epitaxial layer produced by a metalorganic vapor phase growth process, where the etching amount during growth is relatively small, and carbon can be added to a high concentration even with a large MOVPE apparatus.

SUMMARY OF THE INVENTION

The present invention pertains to a manufacturing method of a compound semiconductor having at least one layer, which is a carbon-doped p-type semiconductor epitaxial layer produced by a metalorganic vapor phase growth process, wherein carbon trichloride bromide is used as a carbon source of carbon to be added to the p-type semiconductor epitaxial layer.

DETAILED DESCRIPTION OF THE INVENTION

The manufacturing method of a compound semiconductor of the present invention is characterized in that, in a method for manufacturing a compound semiconductor having at least one layer, which is a carbon-doped p-type semiconductor epitaxial layer produced by a MOVPE process, carbon trichloride bromide is used as a carbon source of carbon to be added to the p-type semiconductor epitaxial layer. Examples of the compound semiconductor include GaAs, $Al_xGa_{1-x}As$ (where $0<x\leq1$), and $In_yGa_{1-y}As$ (where $0<y\leq0.5$).

Carbon trichloride bromide is a chemically stable compound, and enables a stable control of doping in the addition of carbon into compound semiconductors such as GaAs, InGaAs, and AlGaAs in a metalorganic vapor phase growth process.

In the present invention, use of carbon trichloride bromide as a carbon source of carbon, to be added to a semiconductor epitaxial layer, can control the etching amount in comparison with the case where carbon tetrachloride or carbon tetrabromide is used, even if the supply is increased for obtaining a high carrier concentration, or the growth temperature is raised for enhancing the crystallinity of the epitaxial layer. This improves the controllability of the epitaxial film thickness.

Further, the vapor pressure of carbon trichloride bromide (35 mmHg/23° C.) is not as high as that of carbon tetrachloride (100 mmHg/23° C.). However, it is a liquid at room temperature, and the incorporation efficiency of carbon into the epitaxial film is comparable to that of carbon tetrachloride, which enables use even with a large MOVPE apparatus.

EXAMPLES

Below, the examples of the present invention will now be illustrated, which should not be construed as limiting the scope of the present invention.

Example 1

By a MOVPE process with trimethyl gallium (hereinafter, also referred to as TMGa), trimethyl aluminum (hereinafter, also referred to as TMAl), and arsine ($ASH_3$) being used as raw materials, on a GaAs substrate was grown an $Al_{0.5}Ga_{0.05}As$ buffer layer, on which was grown a p-type GaAs doped with carbon using carbon trichloride bromide as a carbon source. The growth temperature of the p-type GaAs layer was set in the range of 580 to 630° C., while the group V/group III ratio was set in the range of 5 to 15.

The p-type GaAs grown under the above-described conditions was evaluated for carrier concentration and mobility at room temperature by Hall effect measurement. Also, selective etching of the p-type GaAs was performed using a citric acid-based etchant to evaluate the grown film thickness by a step difference measuring device.

Figure 1:
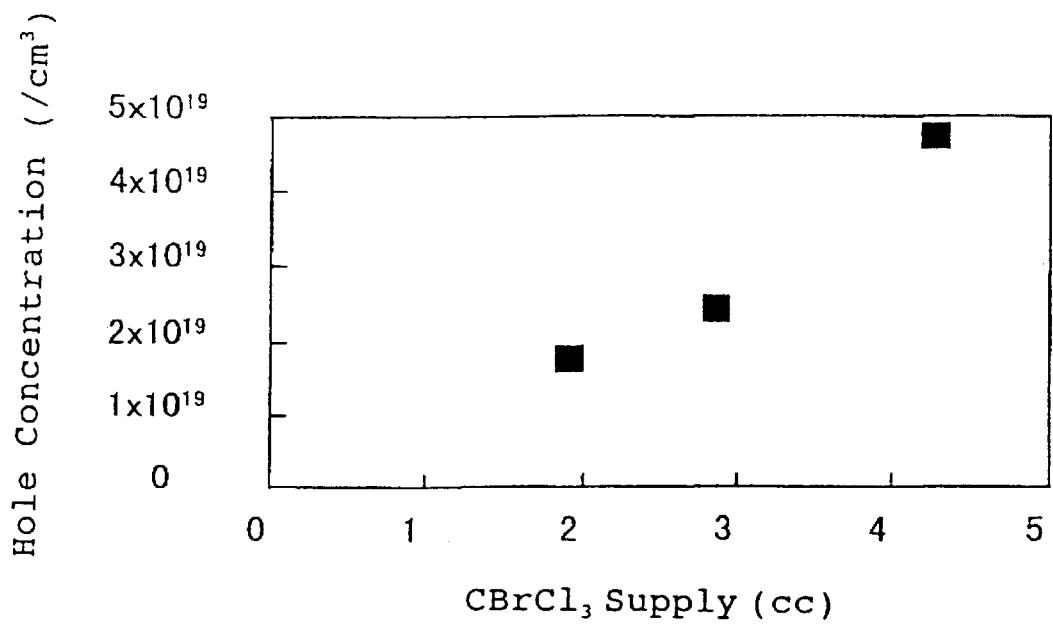
FIG. 1 is a diagram showing the dependency of the carrier concentration of a p-type GaAs with the carbon trichloride bromide supply (example 1)

The relationship between the carrier concentration at room temperature and the carbon source supply of a p-type GaAs with carbon trichloride bromide being used as a carbon source, under the conditions of a growth temperature of 630° C., and group V/group III ratio=15 is shown in FIG. 1. This figure indicates that an increase in supply of carbon trichloride bromide results in an increase in carrier concentration of the p-type GaAs roughly on a proportional basis. Thus, it is revealed that, in the case where carbon trichloride bromide is used as a carbon source, the control is sufficiently possible even if the carrier concentration of the p-type GaAs is $10^{19}/cm^3$ or more.

Figure 2:
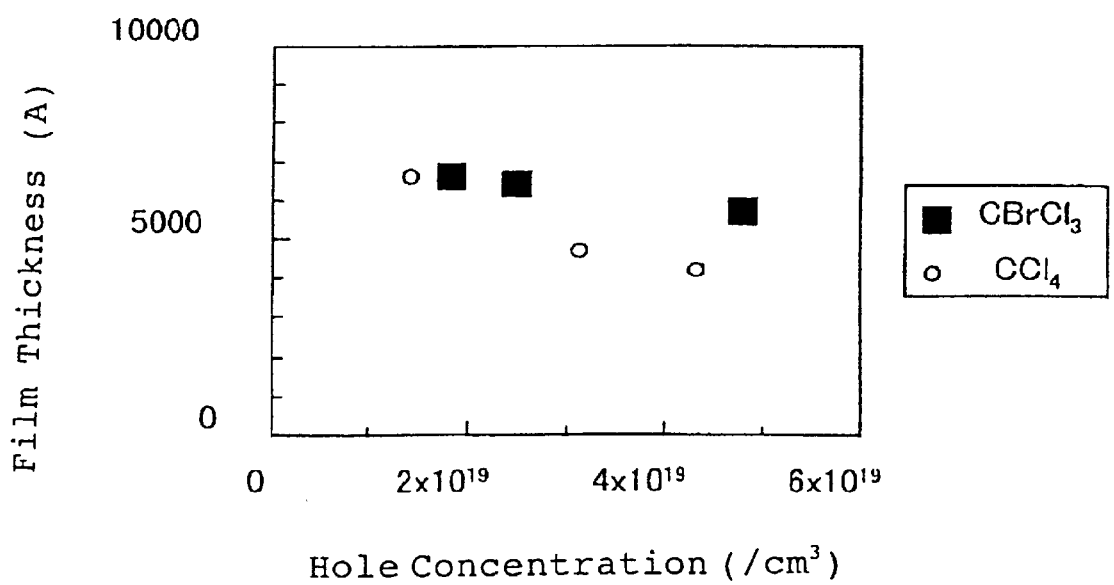
FIG. 2 is a diagram showing the grown film thickness with respect to the hole concentration of the p-type GaAs. The case where carbon trichloride bromide is used is shown with "■" (example 1), while the case where carbon tetrachloride is used is shown with "○" (comparative example 1)

Next, the relationship between the film thickness and the carrier concentration (hole concentration) of a p-type GaAs with carbon trichloride bromide being used as a carbon source is shown with "■" in FIG. 2. Also, in the same figure, the results in the case where carbon tetrachloride is used as a carbon source are shown with "○" (comparative example 1). In the case where carbon trichloride bromide was used, the thickness was found to be approximately 95% of the grown film thickness of the nondoped GaAs with a hole concentration of $1.8 \times 10^{19}/cm^3$, grown under the same conditions. The film thickness of the p-type GaAs having the equal carrier concentration, manufactured using carbon tetrabromide is approximately 90% of that of the film having the equal carrier concentration according to the present invention. This indicates that use of carbon trichloride bromide controls the etching amount.

Figure 3:
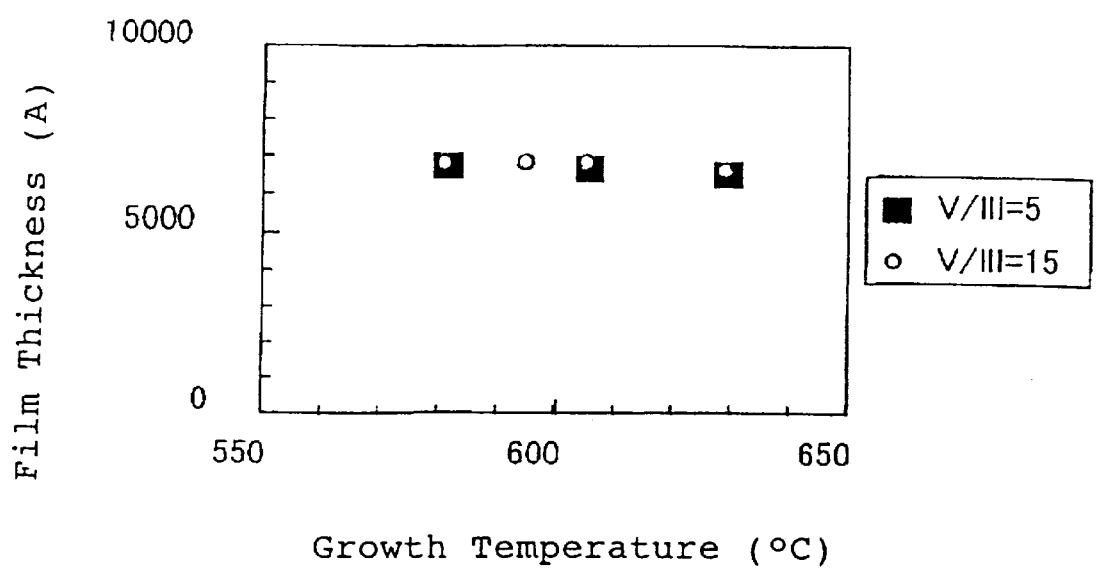
FIG. 3 is a diagram showing the dependency of the grown film thickness of the p-type GaAs with the growth temperature (example 1). The mark ■ denotes the case where the group V/group III ratio=5, while the mark ○ denotes the case where the group V/group III ratio=15.

Also, FIG. 3 shows the growth temperature dependence of the grown film thickness in the case where the supply of carbon trichloride bromide is made constant. It is indicated that there is observed almost no variation in film thickness between the points where the group V/group III ratios are 5 (mark ■), and 15 (mark ○) at temperatures in the range of 580 to 630° C.

Figure 4:
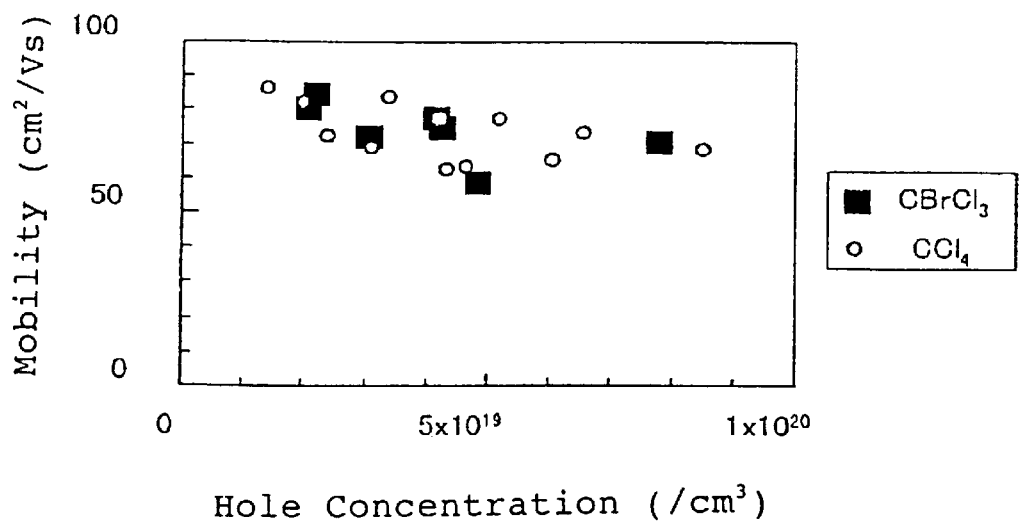
FIG. 4 is a diagram showing the relationship of the carrier concentration and the mobility at room temperature of the p-type GaAs (example 1). The case where carbon trichloride bromide is used as a carbon source is shown with "■", while the case where carbon tetrachloride is used is shown with "○".

The relationship between the carrier concentration and the mobility at room temperature of a p-type GaAs with carbon trichloride bromide being used as a carbon source is shown with "■" in FIG. 4. Also, in the same figure, the results in the case where carbon tetrachloride is used as a carbon source are shown with "○". FIG. 4 indicates that the relationship between the carrier concentration and the mobility of a p-type GaAs with carbon trichloride bromide being used as a carbon source shows the same tendency as that of the one with carbon tetrachloride being used. This reveals that film materials equal in terms of crystallinity can be obtained.

The comparison of the supplies of carbon source required for obtaining the p-type GaAs having the same carrier concentration was performed between carbon trichloride bromide and carbon tetrachloride. Consequently, the efficiencies of both cases were found to be almost the same. Also, the hole concentration of the p-type GaAs could be confirmed up to a maximum of $8 \times 10^{19}/cm^3$ by use of carbon trichloride bromide.

Comparative Example 1

On a GaAs substrate, by a MOVPE process, with trimethyl gallium (TMGa), trimethyl aluminum (TMAl), and arsine ($AsH_3$) being used as raw materials, was grown an $Al_{0.5}Ga_{0.5}As$ buffer layer, on which was grown a p-type GaAs doped with carbon using carbon tetrachloride as a carbon source. The growth temperature of the p-type GaAs layer was set in the range of 580 to 630° C., while the group V/group III ratio was set in the range of 5 to 15. The epitaxial substrate was evaluated for carrier concentration, mobility, and grown film thickness at room temperature of the p-type GaAs by the same technique as that of example 1.

There was observed the proportionality in the relationship between the carrier concentration at room temperature and the carbon source supply of the p-type GaAs with carbon tetrachloride being used as a carbon source as in the case of carbon trichloride bromide.

The relationship between the film thickness and the carbon source supply of the p-type GaAs with carbon tetrachloride being used as a carbon source is shown with "■" in FIG. 2. In the case where carbon tetrachloride is used as a carbon source, as the supply of the carbon source is increased, the grown film thickness exhibits a considerable decrease. This reveals that there occurs etching simultaneously with the growth of the p-type GaAs. In the p-type GaAs having a hole concentration of $4.3 \times 10^{19}/cm^3$, the grown film thickness was found to be approximately 60% of that of the nondoped GaAs grown under the same conditions. The film thickness is 73% of that in the case where the comparable carrier concentration is obtained usin g carbon trichloride bromide as a carbon source under the same growth conditions. Thus, even as compared with carbon tetrachloride, the etching amount can be controlled.

Further, the temperature was similarly raised up to 650° C. with the supply of carbon tetrachloride being made constant. Consequently, there was observed a decrease in grown film thickness like the case where the supply was increased. The decrease in film thickness partly depends upon the supply of the carbon source. However, the film thickness was found to be approximately 80% of that of nondoped GaAs in the case where a hole concentration of $4 \times 10^{19}/cm^3$ or more can be obtained.

According to the pr e sent invention, in doping a GaAs, AlGaAs, or InGaAs semiconductor epitaxial substrate with carbon, doping can be performed with the etching amount during growth being relatively small, and with efficiency by using carbon trichloride bromide as a carbon source. In the case where carbon tetrachloride is used as a carbon source into a p-type GaAs as in the comparative example, an increase in supply, or an increase in growth temperature causes etching, which leads up to an instability in controlling the film thickness. To this end, according to the present invention, as is apparent from the exam pl es, there can be provided a p-type semiconductor epitaxial layer with the etching amount during growth being relatively small, and being doped with carbon to a high concentration, even by a large MOVPE apparatus, for a carbon-doped GaAs, AlGaAs, or InGaAs p-type semiconductor epitaxial layer to be manufactured by a MOVPE method.

What is claimed is:

1. A method for manufacturing a compound semiconductor having at least one layer, which is a carbon-doped p-type semiconductor epitaxial layer produced by a metalorganic vapor phase growth process, wherein carbon trichloride bromide is used as a carbon source of carbon to be added to said p-type semiconductor epitaxial layer.

2. A method for manufacturing a compound semiconductor according to claim 1, wherein said p-type semiconductor epitaxial layer is GaAs.

3. A method for manufacturing a compound semiconductor according to claim 1, wherein said p-type semiconductor epitaxial layer is $Al_xGa_{1-x}As$ (where $0<x\leq1$).

4. A method for manufacturing a compound semiconductor according to claim 1, wherein said p-type semiconductor epitaxial layer is $In_yGa_{1-y}As$ (where $0<y\leq0.5$).

* * * * *